(12) United States Patent
Iorio

(10) Patent No.: US 11,514,198 B2
(45) Date of Patent: *Nov. 29, 2022

(54) DEEP-LEARNING BASED FUNCTIONAL CORRELATION OF VOLUMETRIC DESIGNS

(71) Applicant: AUTODESK, INC., San Francisco, CA (US)

(72) Inventor: Francesco Iorio, Toronto (CA)

(73) Assignee: AUTODESK, INC., San Francisco, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/244,714

(22) Filed: Apr. 29, 2021

(65) Prior Publication Data

US 2021/0248277 A1   Aug. 12, 2021

Related U.S. Application Data

(63) Continuation of application No. 16/424,318, filed on May 28, 2019, now Pat. No. 10,997,323, which is a
(Continued)

(51) Int. Cl.
*G06F 17/00* (2019.01)
*G06F 30/00* (2020.01)
(Continued)

(52) U.S. Cl.
CPC ........... *G06F 30/00* (2020.01); *G06N 3/0454* (2013.01); *G06N 3/08* (2013.01); *G06N 3/084* (2013.01); *G06N 5/022* (2013.01)

(58) Field of Classification Search
CPC ....................................................... G06F 17/50
(Continued)

(56) References Cited

U.S. PATENT DOCUMENTS 8,380,465 B2 * 2/2013 Ravnikar ................ G06T 17/10
703/1
2002/0083076 A1   6/2002 Wucherer et al.
(Continued)

FOREIGN PATENT DOCUMENTS

CN   101447094 A   6/2009
CN   102609991 A   7/2012

OTHER PUBLICATIONS

Rumelhart et al., "Learning representations by back-propagating errors", Nature vol. 323, Oct. 9, 1986, pp. 533-536.
(Continued)

*Primary Examiner* — Andy Ho
(74) *Attorney, Agent, or Firm* — Artegis Law Group, LLP

(57) ABSTRACT

A design application receives an exemplary design from an end-user having one or more functional attributes relevant to solving a design problem. The design application then generates a set of labels that describes the functional attributes of the exemplary design. Based on the set of labels, the design application explores a functional space to retrieve one or more system classes having functionally descriptive labels that are similar to the set of labels generated for the exemplary design. The one or more system classes include different approaches to solving the design problem, and represent systems having at least some functional attributes in common with the exemplary design.

23 Claims, 5 Drawing Sheets

Related U.S. Application Data continuation of application No. 15/158,501, filed on May 18, 2016, now Pat. No. 10,303,811.

(60) Provisional application No. 62/199,949, filed on Jul. 31, 2015.

(51) Int. Cl.
  G06N 3/04 (2006.01)
  G06N 3/08 (2006.01)
  G06N 5/02 (2006.01)

(58) Field of Classification Search
  USPC .............................................................. 703/1
  See application file for complete search history.

(56) References Cited

U.S. PATENT DOCUMENTS

| | | | |
|---|---|---|---|
| 2007/0078634 | A1 | 4/2007 | Krishnapillai |
| 2012/0054601 | A1 | 3/2012 | Cohen et al. |
| 2012/0169727 | A1 | 7/2012 | Ravnikar et al. |
| 2014/0372960 | A1 | 12/2014 | Ward |
| 2016/0179945 | A1 | 6/2016 | Lastra et al. |

OTHER PUBLICATIONS

Y LeCun et al. Gradient-based learning applied to document recognition. Proceedings of the IEEE 6{11}:2278-2324, 1998).

A Krizhevsky et al. Imagenel classification with deep convolutional neural networks. In Advances in Neural Information Processing Systems {NIPS} (2012).

R Wu et al. Deep Image: Scaling up Image Recognition. arXiv:1501.02876 (2015).

J Bergstra and Y Bengio. Random Search for Hyper-Parameter Optimization. J_ of Mach. Learning Res. 13: 281-305 2012).

J Snoek et al. Practical Bayesian Optimization of Machine Learning Algorithms. In Neural Info. Proc. Sys. (2012).

X Graves and N Jailly. Towards End-Io-End Speech Recognition with Recurrent Neural Networks. In International Conference on Machine Learning (2014).

V Mnih et al. Human-level control through deep reinforcement learning. Nature 518:529-533 (2015).

V Mnih et al. Recurrent Models of Visual Attention. Neural Info. Proc. Sys. (2014).

S Ioffe et al. Balch Normalization: Accelerating Deep Network Training by Reducing Internal Covariate Shift. arXiv:1502.03167 (2015).

A Cotter et al. Beller Mini-Balch Algorithms via Accelerated Gradient Methods. In Adv. in Neur. Info. Proc. Sys. (2011 ).

N Srivastava et al. Dropout: a simple way to prevent neural networks from overfilling. J_ of Mach. Learn. Res. 15:1929-1958 (2014).

S Hochreiter and J Schmidhuber. Long Short-Term Memory. Neural Computation 9(8):1735-1780 (1997).

Xu et al., "3D Shape Retrieval Integrated with Classification Information", Image and Graphics, Fourth International Conference on Image and Graphics, Aug. 1, 2007, pp. 774-779.

Zhansong et al., "Annotation and Retrieval System of CAD Models Based on Functional Semantics", Chinese Journal of Mechanical Engineering, vol. 27, No. 6, Oct. 27, 2014, pp. 1-13.

Peng, Wang, "A retrieval method of mechanical part based on ontology", Energy Procedia, vol. 13, Dec. 10, 2011, pp. 5100-5106.

Non Final Office Action received for U.S. Appl. No. 15/158,501, dated Aug. 10, 2018, 15 pages.

Notice of Allowance received for U.S. Appl. No. 15/158,501, dated Jan. 14, 2019, 5 pages.

Non Final Office Action received for U.S. Appl. No. 16/424,318, dated Jul. 24, 2020, 16 pages.

Notice of Allowance received for U.S. Appl. No. 16/424,318, dated Jan. 8, 2021, 9 pages.

\* cited by examiner

DEEP-LEARNING BASED FUNCTIONAL CORRELATION OF VOLUMETRIC DESIGNS

CROSS-REFERENCE TO RELATED APPLICATIONS

This application is a continuation of the U.S. patent application titled, "DEEP-LEARNING BASED FUNCTIONAL CORRELATION OF VOLUMETRIC DESIGNS," filed on May 28, 2019 and having Ser. No. 16/424,318, which is a continuation of the U.S. patent application titled, "DEEP-LEARNING BASED FUNCTIONAL CORRELATION OF VOLUMETRIC DESIGNS," filed on May 18, 2016 and having Ser. No. 15/158,501, issued as U.S. Pat. No. 10,303,811, which claims the priority benefit of the U.S. Provisional Patent Application titled, "DEEP-LEARNING BASED FUNCTIONAL CORRELATION OF VOLUMETRIC DESIGNS," filed on Jul. 31, 2015 and having Ser. No. 62/199,949. The subject matter of these related applications is hereby incorporated herein by reference.

BACKGROUND OF THE INVENTION

Field of the Invention

Embodiments of the present invention relate generally to computer-aided design and, more specifically, to deep learning based functional correlation of volumetric designs.

Description of the Related Art

In a conventional engineering workflow, an engineer uses a computer-aided design (CAD) tool to design physical parts that meet certain design criteria. For example, the engineer could design a cantilever capable of supporting a particular load within a building structure. This process can be inefficient, though, because an engineer is only capable of exploring one design option at a time.

To resolve this problem, advanced CAD tools implement a technique referred to as "generative design." In operation, a generative design CAD tool receives a specification from the engineer that dictates the desired functional attributes associated with a successful design. Then, the generative design tool creates a spectrum of designs having the desired functional attributes.

One problem with generative design tools is that at least one functional attribute is needed as a starting point to generating a spectrum of designs. However, engineers may have difficulty specifying the relevant functional attributes of a successful design, which renders the generative design CAD tool ineffective. For example, an engineer may intuitively understand that a particular load must somehow be supported, yet have difficulty articulating this requirement as one or more functional attributes. Without at least one functional attribute as a starting point, a generative design CAD tool cannot generate a spectrum of designs.

As the foregoing illustrates, what is needed in the art is a more effective approach for specifying functional attributes of potentially successful designs for generative CAD tools.

SUMMARY OF THE INVENTION

Various embodiments of the present invention set forth a computer-implemented method for generating one or more design approaches that include one or more desired functional attributes, including generating, based on an exemplary design, a first set of labels that describe a first plurality of functional attributes of the exemplary design, determining, based on the first set of labels, a second set of labels that describe a second plurality of functional attributes of a first class of systems, and extracting, based on the second set of labels, the first class of systems from a functional space that includes a plurality of system classes, where each system in the first class of systems has at least one functional attribute directed towards solving the design problem.

At least one advantage of the approach discussed herein is that the end-user is not required to manually explore a vast and complex design space to identify feasible design options. Instead, the end-user need only provide at least one example of a design having functional attributes relevant to solving the design problem. The design application then identifies one or more system classes also having functional attributes relevant to solving the design problem.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

System Overview

In the following description, numerous specific details are set forth to provide a more thorough understanding of the present invention. However, it will be apparent to one of skill in the art that the present invention may be practiced without one or more of these specific details.

Figure 1:
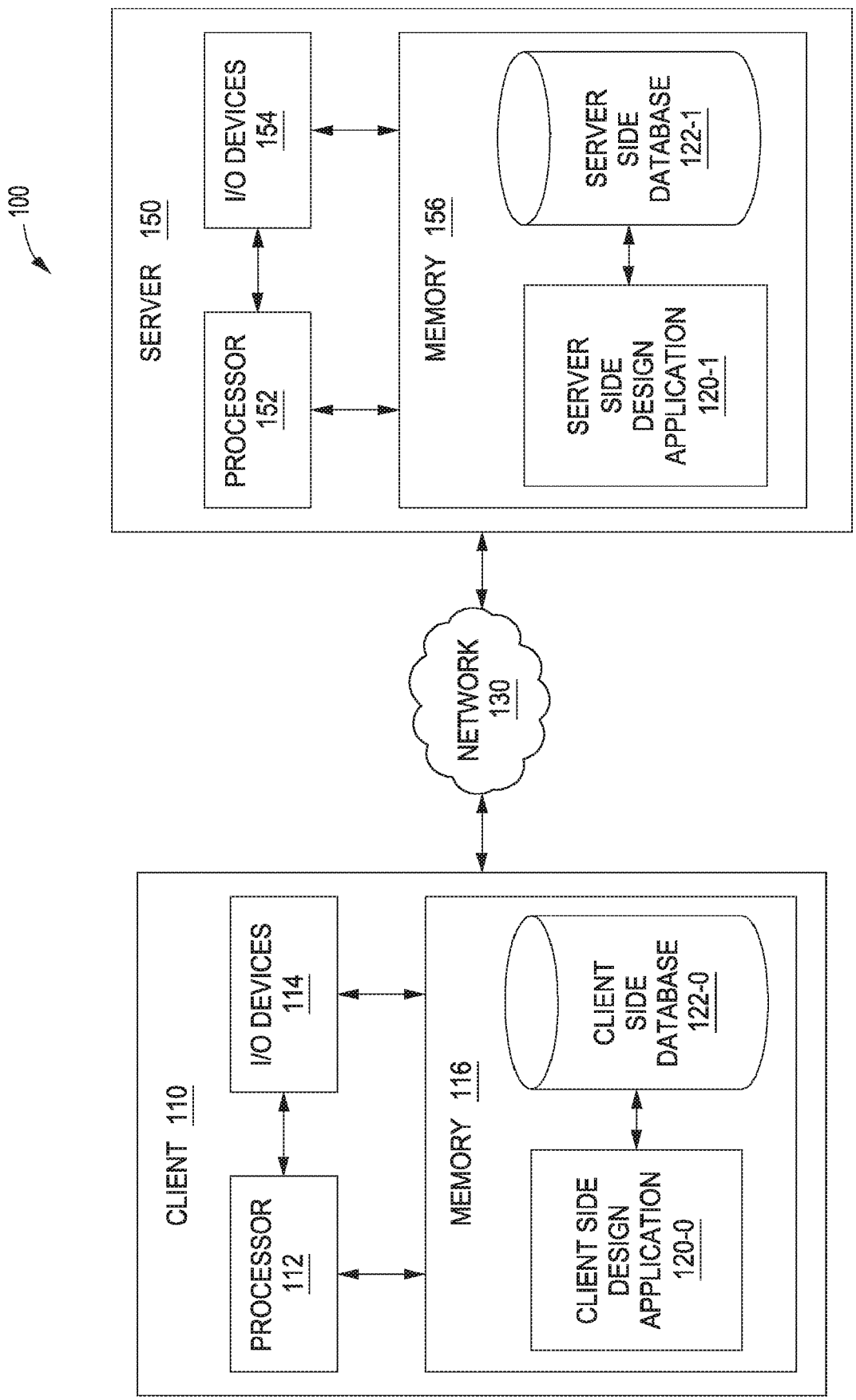
FIG. 1 illustrates a system configured to implement one or more aspects of the present invention.

FIG. 1 illustrates a system 100 configured to implement one or more aspects of the present invention. As shown, system 100 includes a client 110 coupled via a network 130 to a server 150. Client 110 may be any technically feasible variety of client computing device, including a desktop computer, laptop computer, mobile device, and so forth.

Network 150 may be any technically feasible set of interconnected communication links, including a local area network (LAN), wide area network (WAN), the World Wide Web, or the Internet, among others. Server 150 may be any technically feasible type of server computing device, including a remote virtualized instance of a computing device, one or more physical cloud-based computing devices, a combination of the two, a portion of a datacenter, and so forth.

Client 110 includes processor 112, input/output (I/O) devices 114, and memory 116, coupled together. Processor 112 may be any technically feasible form of processing device configured process data and execute program code. Processor 112 could be, for example, a central processing unit (CPU), a graphics processing unit (GPU), an application-specific integrated circuit (ASIC), a field-programmable gate array (FPGA), and so forth. I/O devices 114 may include devices configured to receive input, including, for example, a keyboard, a mouse, and so forth. I/O devices 114 may also include devices configured to provide output, including, for example, a display device, a speaker, and so forth. I/O devices 114 may further include devices configured to both receive and provide input and output, respectively, including, for example, a touchscreen, a universal serial bus (USB) port, and so forth.

Memory 116 may be any technically feasible storage medium configured to store data and software applications. Memory 116 could be, for example, a hard disk, a random access memory (RAM) module, a read-only memory (ROM), and so forth. Memory 116 includes client-side design application 120-0 and client-side database 122-0. Client-side design application 120-0 is a software application that, when executed by processor 112, causes processor 112 to generate one or more classes of systems applicable to solving a design problem. In doing so, client-side design application 120-0 may access client-side database 122-0. Client-side design application 122-0 may also interoperate with a corresponding design application that resides within server 150 and access a database that also resides on server 150, as described in greater detail below.

Server 150 includes processor 152, I/O devices 154, and memory 156, coupled together. Processor 152 may be any technically feasible form of processing device configured to process data and execute program code, including a CPU, a GPU, an ASIC, an FPGA, and so forth. I/O devices 114 may include devices configured to receive input, devices configured to provide output, and devices configured to both receive and provide input and output, respectively.

Memory 156 may be any technically feasible storage medium configured to store data and software applications, including a hard disk, a RAM module, a ROM, and so forth. Memory 156 includes server-side design application 120-1 and server-side database 122-1. Server-side design application 120-1 is a software application that, when executed by processor 156, causes processor 152 to generate one or more classes of systems applicable to solving a design problem. In doing so, server-side design application 120-1 may access server-side database 122-1. Server-side design application 122-1 may also interoperate with client-side design application 120-0 and access client-side database 122-0.

In operation, client-side design application 120-0 and server-side design application 120-1 cooperate to implement any and all of the inventive functionality described herein. In doing so, either one or both of client-side design application 120-0 and server-side design application 120-1 may access either one or both of client-side database 122-0 and server-side database 122-1. Generally, client-side design application 120-0 and server-side design application 120-1 represent different portions of single distributed software entity. Thus, for simplicity, client-side design application 122-0 and server-side design application 122-1 will be collectively referred to herein as design application 120. Similarly, client-side database 122-0 and server-side database 122-1 represent different portions of a single distributed storage entity. Therefore, for simplicity, client-side database 122-0 and server-side database 122-1 will be collectively referred to herein as database 122.

As described in greater detail below in conjunction with FIG. 2, design application 120 is configured to interact with an end-user in order to receive an exemplary design that is applicable to solving a design problem. Then, design application 120 generates a set of labels that describe functional attributes of the exemplary design. Based on these labels, design application 120 identifies one or more classes of systems having similar functional attributes. Design application 120 then provides these system classes to the end-user. An advantage of this approach is that design application 120 can provide the end-user with a wide variety of different types of approaches to solving the design problem using the exemplary design as a starting point.

Figure 2:
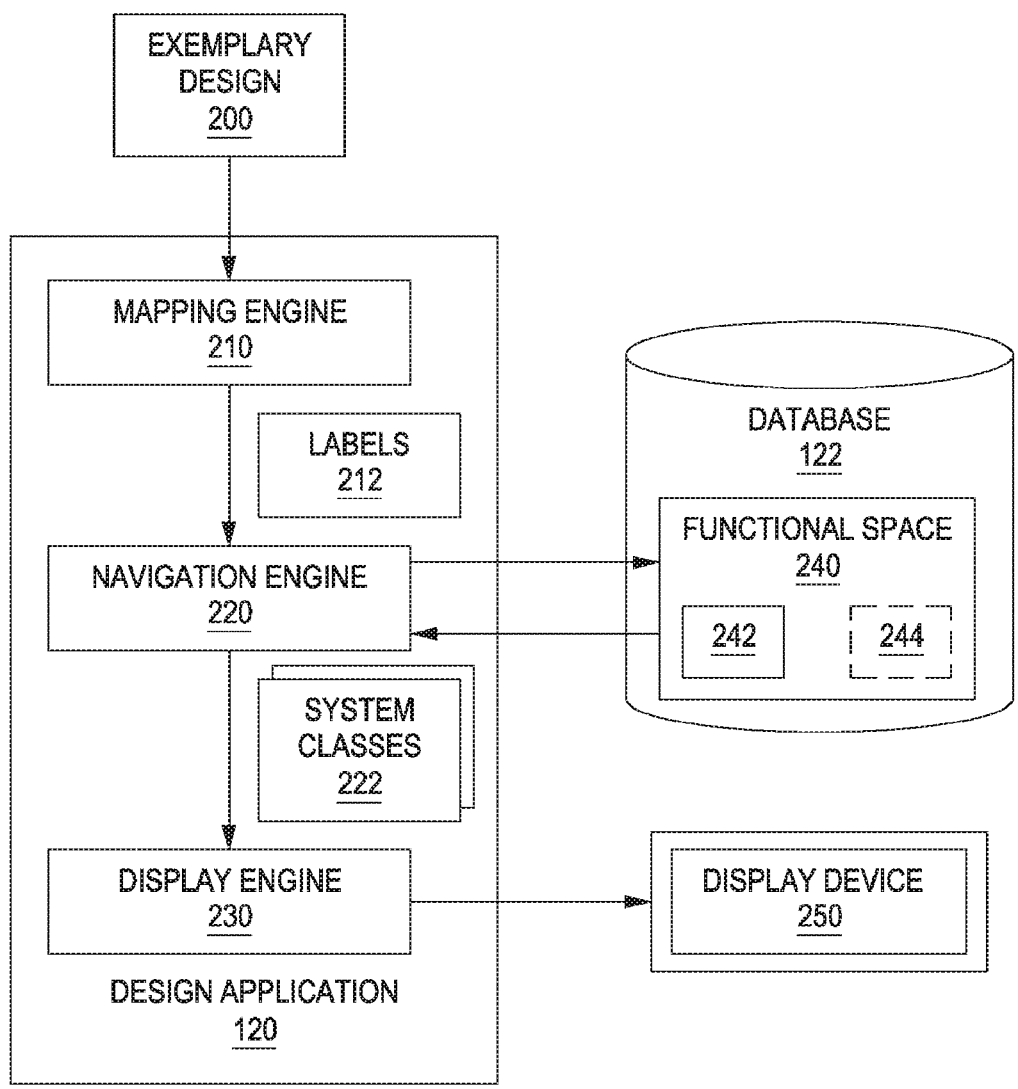
FIG. 2 is a more detailed illustration of the design application of FIG. 1, according to various embodiments of the present invention.

FIG. 2 is a more detailed illustration of the design application of FIG. 1, according to various embodiments of the present invention. As shown, design application 120 includes a mapping engine 210, a navigation engine 220, and a display engine 230. Database 122 includes a functional space 240. Functional space 240 includes a system space 242 and an ontological space 244.

In operation, mapping engine 210 receives exemplary design 200 from an end-user. Exemplary design 200 includes a graphical depiction of a design. For example, exemplary design 200 could include an image, a CAD model, or any other technically feasible design representation. Exemplary design 200 generally has one or more functional attributes that are relevant to the design problem. For example, if the design problem involved supporting a load, then exemplary design 200 could depict a bookshelf configured to support a load. Exemplary design 200 does not necessarily have a specific structure that is needed to solve the design problem, although the structure of exemplary design 200 may reflect one approach to solving the design problem.

Mapping engine 210 is configured to process exemplary design 200 and to then generate a set of labels 212 that describe, using natural language, functional attributes of exemplary design 200. For example, if exemplary design 200 depicts a wheel, then mapping engine 210 could generate labels 212 such as "rolls on surfaces." Each label 212 could include any number of discrete words, phrases, or sentences, although in practice, labels 212 are triplets of words.

Mapping engine 210 may implement a wide variety of different techniques, including machine learning, computer vision, artificial neural networks, and so forth, to generate labels 212 based on exemplary design 200. In practice, mapping engine 210 includes an artificial neural network that is trained to generate labels based on a training set. The training set includes a collection of exemplary designs and, for each design, a corresponding set of labels. During training, one or more sets of weights included in the artificial neural network of mapping engine 210 are adjusted to cause mapping engine 210 to correctly generate each set of labels for each design in the training set. In one embodiment, mapping engine 210 includes a convolutional neural network that is trained via backpropagation. Persons skilled in the art will understand that many techniques exist for training artificial neural networks to generate descriptive labels based on graphical data, any of which may be implemented to generate mapping engine 210.

Navigation engine 220 receives labels 212 from mapping engine 210 and then explores functional space 240 to identify one or more system classes 222. Functional space 240 is a multidimensional data construct that includes a system space 242 and a corresponding ontological space 244. System space 242 includes different classes of systems that can be applied to solving design problems. For example, in the context of mechanical design, one system class 222 could be "trusses." Ontological space 244 includes, for any given class of systems, a set of labels that describes functional attributes of the systems in that class. For example, ontological space 244 could include, for the truss class mentioned above, labels such as "connects two locations," "supports weight," "distributes stress," and so forth.

Navigation engine 220 explores functional space 240 by identifying, within ontological space 244, different sets of labels that are similar to labels 212. Persons skilled in the art will understand that many different approaches exist for determining similarity between different sets of words. For example, Word2Vec could be used to assign a vector to each word, and then a distance function may be applied to determine the distance between any two vectors. This approach can be extended to determine the similarity between two labels, each of which includes multiple words. After one or more similar labels have been located within ontological space 244, navigation engine 220 then retrieves the system classes from system space 242 corresponding to those labels, shown as system classes 222.

Each system class 222 represents an approach to solving the design problem associated with exemplary design 200. For example, if the design problem involved the modulation of a stream of fluid, then one system class 222 could include different types of nozzles. Generally, each system class 222 represents a type of system having similar functional attributes to exemplary design 200.

Because navigation engine 220 explores functional space 240 based on labels 212, system classes 222 identified via that exploration are functionally similar to exemplary design 200, but not necessarily structurally similar. For example, suppose exemplary design 200 represents a lubricant. Labels 212 could indicate that the lubricant "reduces friction." Based on this particular label, navigation engine 220 could retrieve from functional space 240 a "ball bearing" class of systems. Lubricants and ball bearings are not structurally similar, although both "reduce friction." System classes 222 may include several structurally similar or dissimilar classes, although each system class 222 is at least somewhat functionally similar to exemplary design 200.

Navigation engine 220 provides system classes 222 to display engine 230. Display engine 230 then causes display device 250 to output each different system class 222 to the end-user. Functional space 240 is described in greater detail, by way of example, below in conjunction with FIGS. 3-4.

Mapping Exemplary Designs into a Functional Space

Figure 3:
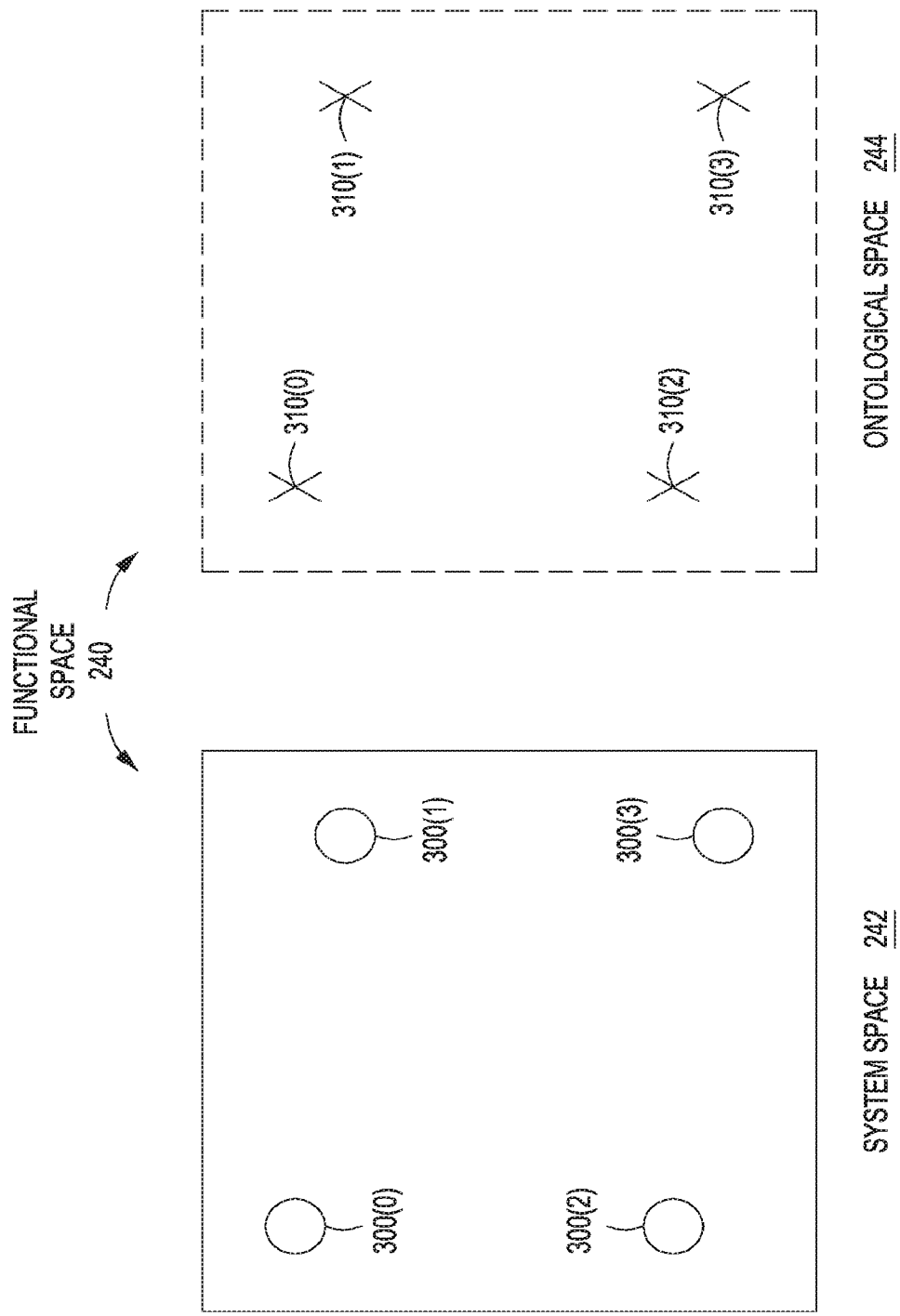
FIG. 3 is an exemplary illustration of the functional space of FIG. 2, according to various embodiments of the present invention.

FIG. 3 is an exemplary illustration of the functional space of FIG. 2, according to various embodiments of the present invention. As shown, functional space 240 includes system space 242 and ontological space 244, as also shown in FIG. 3. System space 242 includes system classes 300(0), 300(1), 300(2), and 300(3). Ontological space includes sets 310(0), 310(1), 310(2), and 310(3) of labels. Each set 310 of labels corresponds to a different system class 300 and describes, using natural language, functional attributes of that system class 300. Set 310(0) of labels describes functional attributes of system class 300(0), set 310(1) of labels describes functional attributes of system class 300(1), set 310(2) of labels describes functional attributes of system class 300(2), and set 310(3) of labels describes functional attributes of system class 300(3).

Functional space 240 as a whole may be generated via a wide variety of different approaches. For example, an artificial neural network (such as that included in mapping engine 210) could generate functional space 240 by analyzing different designs associated with specific system classes and then assigning sets 310 of labels to each such class. Alternatively, a team of human experts could generate functional space 240 by analyzing a spectrum of system classes and then generating sets 310 of labels manually. A combination of these two approaches may also be implemented.

Figure 4:
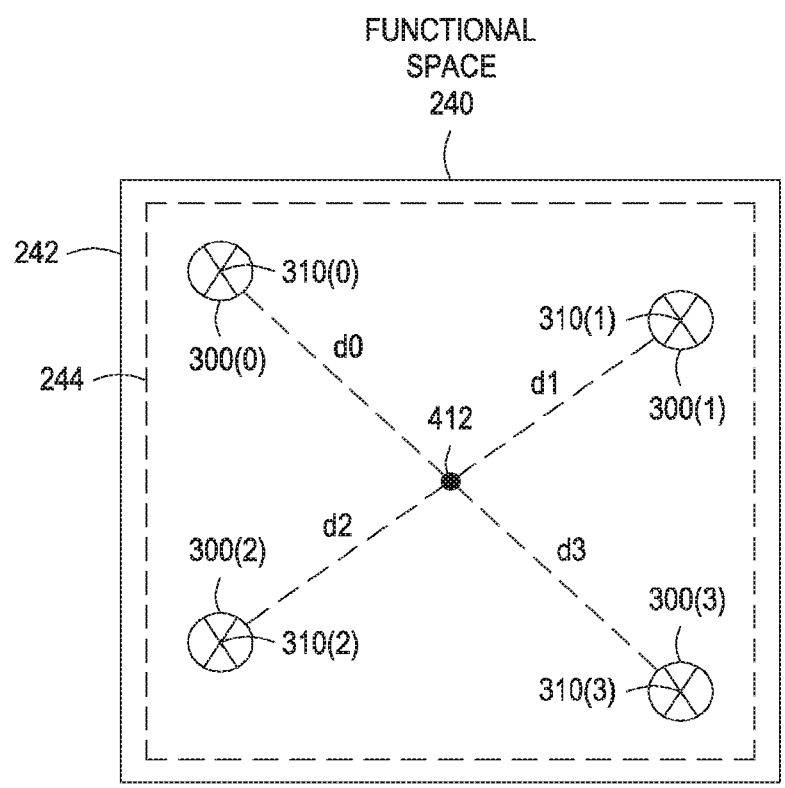
FIG. 4 illustrates an example of how the exemplary design of FIG. 2 is mapped into the functional space of FIG. 3, according to various embodiments of the present invention.

Although functional space 240 is shown divided into system space 242 and ontological space 244, because these two spaces directly correspond to one another, functional space 240 can also be considered as one unified space generated from the synthesis of system space 242 and ontological space 244, as shown in FIG. 4.

FIG. 4 illustrates an example of how the exemplary design of FIG. 2 is mapped into the functional space of FIG. 3, according to various embodiments of the present invention. In FIG. 4, functional space 240 is shown as the synthesis of system space 242 and ontological space 244 in the manner mentioned above. In this depiction, each system class 300 and corresponding set 310 of labels occupies a different position within functional space 240. For simplicity, functional space 240 is shown as a two-dimensional (2D) plane, although functional space 240 may have any dimension. Further, for visualization purposes, functional space 240 may be projected from a higher dimensionality to a lower dimensionality.

When navigation engine 220 explores functional space 240 using labels 212, navigation engine 220 first identifies a location within functional space 240 that corresponds to those labels. In doing so, navigation engine 220 may treat each label within labels 212 as a different coordinate, and then determine a location for labels 212 within functional space 240 based on those different coordinates. In some situations, the determined location may correspond to a system class 300. In such situations, navigation engine 220 retrieves the corresponding system class 300 and outputs that class to the end-user for review. That system class 300 should have very similar functional attributes as exemplary design 200.

However, under other circumstances navigation engine 220 may determine a location for labels 212 that falls between different system classes 300. For example, suppose navigation engine 220 identifies position 412 based on labels 212. Position 412 does not directly correspond to any particular system class 300. When this condition occurs, navigation engine 220 computes the distance between position 412 and the positions of each different system class 300. As shown, navigation engine computes distances d0, d1, d2, and d3 between position 412 and the positions of system classes 300(0), 300(1), 300(2), and 300(3).

Navigation engine 220 may implement any technically feasible distance function to generate distances d0 through d3. For example, navigation engine 220 could implement a Euclidean distance function. Navigation engine 220 then compares the various computed distances and determines one or more system classes 300 residing closest to position 412. Navigation engine 220 then outputs these closest system classes to the end-user. As a general matter, these "close" system classes should have at least some functional attributes in common with exemplary design 200 due to the proximity of those classes to position 412.

The approach described above advantageously assists the end-user with determining one or more classes of systems that can be applied to solving the design problem exemplified by exemplary design 200. With this approach, the end-user is not required to manually explore a vast and complex design space, and need only provide at least one example of a design having functional attributes relevant to solving the design problem.

Persons skilled in the art will recognize that the techniques described above may be expanded in a number of different ways. For example, design application 120 could receive more than one exemplary design 200. Each exemplary design could include exemplify different functional attributes that, taken together, could represent a solution to the design problem. Persons skilled in the art will also recognize that the techniques described herein may be applied to any branch of engineering, including mechanical design, fluid computations, electrical circuit layouts, and so forth. In one embodiment, design application 120 may access an array of different functional spaces, each corresponding to a different engineering discipline. The specific techniques described above are also described in stepwise fashion below in conjunction with FIG. 5.

Procedure for Generating Potential Design Solutions

Figure 5:
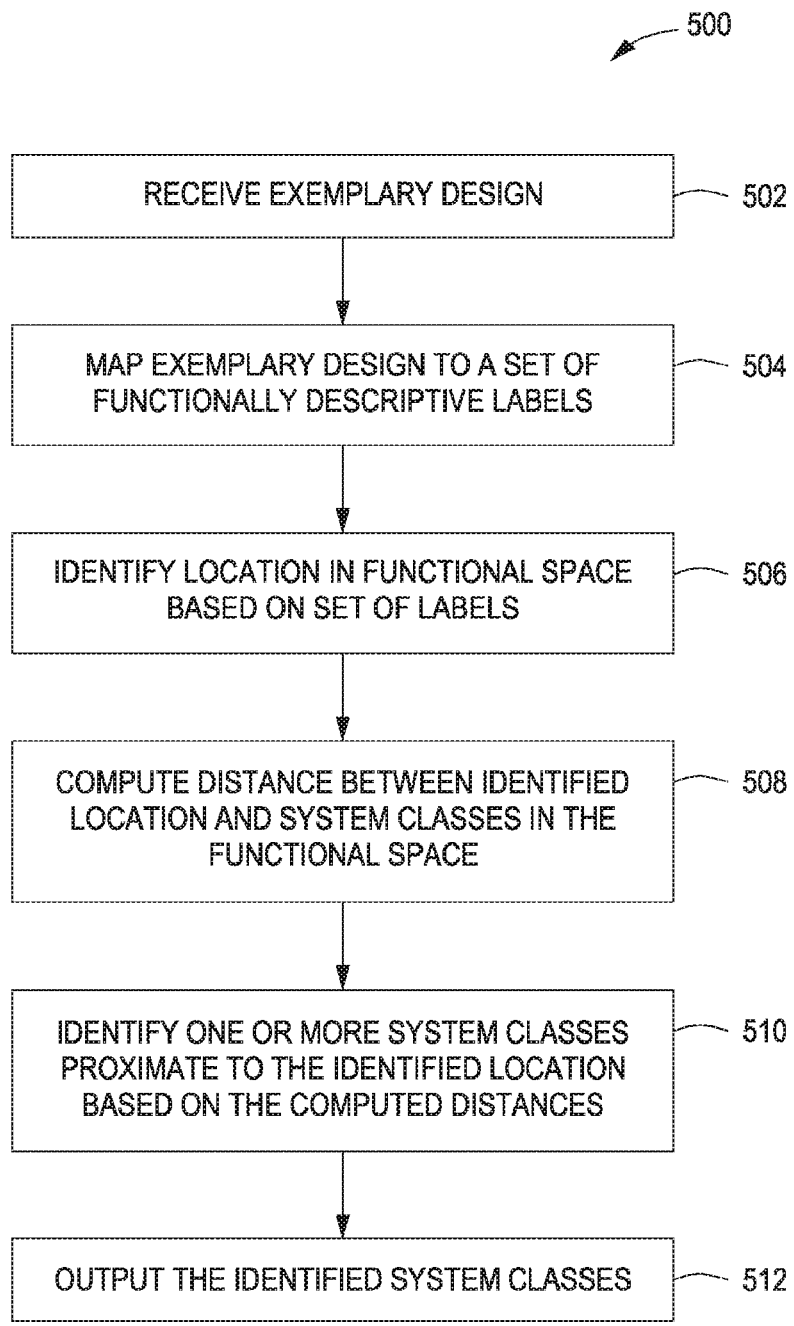
FIG. 5 is a flow diagram of method steps for generating a set of potential design approaches based on functional attributes of an exemplary design, according to various embodiments of the present invention.

FIG. 5 is a flow diagram of method steps for generating a set of potential design approaches based on functional attributes of an exemplary design, according to various embodiments of the present invention. Although the method steps are described in conjunction with the systems of FIGS. 1-4, persons skilled in the art will understand that any system configured to perform the method steps, in any order, is within the scope of the present invention.

As shown, a method 500 begins at step 502, where mapping engine 210 within design application 120 receives exemplary design 200. Exemplary design 200 includes a graphical depiction of a design. For example, exemplary design 200 could include an image, a CAD model, or any other technically feasible design representation. Exemplary design 200 generally has one or more functional attributes that are relevant to the design problem. Exemplary design 200 does not necessarily have a specific structure that is needed to solve the design problem, although the structure of exemplary design 200 may reflect one approach to solving the design problem.

At step 504, mapping engine 210 maps exemplary design 210 to a set of functionally descriptive labels 212. The set of labels 212 describe, using natural language, functional attributes of exemplary design 200. For example, if exemplary design 200 depicts a simple harmonic oscillator, then mapping engine 210 could generate labels 212 such as "oscillates periodically."

At step 506, navigation engine 220 within design application 120 identifies a location in functional space 240 based on labels 212. In doing so, navigation engine 220 may treat each label within labels 212 as a different coordinate, and then determine a location for labels 212 within functional space 240 based on those different coordinates.

At step 508, navigation engine 220 computes the distance between the identified location and the locations of other system classes in functional space 240. Navigation engine 220 may implement any technically feasible distance function to compute those distances. For example, navigation engine 220 could implement a Euclidean distance function.

At step 510, navigation engine 220 identifies system classes 222 residing proximate to the identified location based on the computed distances. As a general matter, these proximate system classes should have at least some functional attributes in common with exemplary design 200 due to the proximity of those classes to the location identified at step 506.

At step 512, display engine 230 outputs system classes 222 identified at step 510 to the end-user via display device 250.

In sum, a design application receives an exemplary design from an end-user having one or more functional attributes relevant to solving a design problem. The design application then generates a set of labels that describes the functional attributes of the exemplary design. Based on the set of labels, the design application explores a functional space to retrieve one or more system classes having functionally descriptive labels that are similar to the set of labels generated for the exemplary design. The one or more system classes include different approaches to solving the design problem, and represent systems having at least some functional attributes in common with the exemplary design.

At least one advantage of the approach discussed herein is that the end-user is not required to manually explore a vast and complex design space to identify feasible design options. Instead, the end-user need only provide at least one example of a design having functional attributes relevant to solving the design problem. The design application then identifies one or more system classes also having functional attributes relevant to solving the design problem.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors or gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

The invention claimed is:

1. A computer-implemented method, comprising:
    generating, via an artificial neural network, a first set of labels that describes a first plurality of functional attributes of an exemplary design; and
    determining a first class of systems based on the first set of labels, wherein each system included in the first class of systems has at least one functional attribute directed towards solving a design problem.

2. The computer-implemented method of claim 1, wherein determining the first class of systems comprises:
    determining, based on the first set of labels, a second set of labels that describes a second plurality of functional attributes of the first class of systems; and
    extracting, based on the second set of labels, the first class of systems from a functional space that includes a plurality of system classes.

3. The computer-implemented method of claim 2, wherein determining the second set of labels comprises:
    determining a first location for the first set of labels within the functional space; and
    determining that the second set of labels resides closest to the first set of labels within the functional space relative to one or more other sets of labels residing within the functional space.

4. The computer-implemented method of claim 2, wherein the second plurality of functional attributes includes one or more functional attributes included in the first plurality of functional attributes.

5. The computer-implemented method of claim 2, wherein the functional space comprises a plurality of locations corresponding to a plurality of sets of functionally descriptive labels.

6. The computer-implemented method of claim 2, wherein the functional space comprises a plurality of locations corresponding to the plurality of system classes.

7. The computer-implemented method of claim 2, wherein each system class included in the plurality of system classes is described by a different set of functionally descriptive labels associated with the functional space.

8. The computer-implemented method of claim 2, wherein the functional space comprises a multidimensional data structure.

9. The computer-implemented method of claim 1, wherein the exemplary design comprises a multidimensional rendering having one or more functional attributes directed towards solving the design problem.

10. The computer-implemented method of claim 1, wherein the first set of labels comprises a sequence of words derived from a natural language.

11. The computer-implemented method of claim 1, wherein the artificial neural network is trained by adjusting a set of weights to cause the artificial neural network to correctly generate a set of functionally descriptive labels associated with a sample design.

12. A non-transitory computer-readable medium storing program instructions that, when executed by a processor, cause the processor to perform the steps of:
    generating, via an artificial neural network, a first set of labels that describes a first plurality of functional attributes of an exemplary design; and
    determining a first class of systems based on the first set of labels, wherein each system included in the first class of systems has at least one functional attribute directed towards solving a design problem.

13. The non-transitory computer-readable medium of claim 12, wherein determining the first class of systems comprises:
    determining, based on the first set of labels, a second set of labels that describes a second plurality of functional attributes of the first class of systems; and
    extracting, based on the second set of labels, the first class of systems from a functional space that includes a plurality of system classes.

14. The non-transitory computer-readable medium of claim 13, wherein determining the second set of labels comprises:
    determining a first location for the first set of labels within the functional space; and determining that the second set of labels resides closest to the first set of labels within the functional space relative to one or more other sets of labels residing within the functional space.

15. The non-transitory computer-readable medium of claim 13, wherein the second plurality of functional attributes includes one or more functional attributes included in the first plurality of functional attributes.

16. The non-transitory computer-readable medium of claim 13, wherein the functional space comprises a plurality of locations corresponding to a plurality of sets of functionally descriptive labels.

17. The non-transitory computer-readable medium of claim 13, wherein the functional space comprises a plurality of locations corresponding to the plurality of system classes.

18. The non-transitory computer-readable medium of claim 13, wherein each system class included in the plurality of system classes is described by a different set of functionally descriptive labels associated with the functional space.

19. The non-transitory computer-readable medium of claim 13, wherein the functional space comprises a multidimensional data structure.

20. The non-transitory computer-readable medium of claim 12, wherein the exemplary design comprises a multidimensional rendering having one or more functional attributes directed towards solving the design problem.

21. The non-transitory computer-readable medium of claim 12, wherein the first set of labels comprises a sequence of words derived from a natural language.

22. The non-transitory computer-readable medium of claim 12, wherein the artificial neural network is trained by adjusting a set of weights to cause the artificial neural network to correctly generate a set of functionally descriptive labels associated with a sample design.

23. A system, comprising:
one or more memories storing instructions, and
one or more processors that are coupled to the one or more memories and,
when executing the instructions are configured to:
generate, via an artificial neural network, a first set of labels that describes a first plurality of functional attributes of an exemplary design; and
determine a first class of systems based on the first set of labels, wherein each system included in the first class of systems has at least one functional attribute directed towards solving a design problem.

* * * * *